US009087938B2

(12) United States Patent
Usui et al.

(10) Patent No.: US 9,087,938 B2
(45) Date of Patent: Jul. 21, 2015

(54) ELECTRODE FOR DYE-SENSITIZED SOLAR CELL, PRODUCTION METHOD OF SAME AND DYE-SENSITIZED SOLAR CELL

(71) Applicant: FUJIKURA LTD., Koto-ku, Tokyo (JP)

(72) Inventors: Hiroki Usui, Chiba (JP); Hiroshi Matsui, Tokyo (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 13/713,724

(22) Filed: Dec. 13, 2012

(65) Prior Publication Data

US 2013/0118574 A1 May 16, 2013

Related U.S. Application Data

(63) Continuation of application No. PCT/JP2011/063762, filed on Jun. 16, 2011.

(30) Foreign Application Priority Data

Jun. 16, 2010 (JP) ................................. 2010-137769

(51) Int. Cl.
*H01L 51/00* (2006.01)
*H01L 31/0224* (2006.01)
*H01L 31/18* (2006.01)
*H01G 9/20* (2006.01)
*H01L 51/44* (2006.01)

(52) U.S. Cl.
CPC ...... *H01L 31/022425* (2013.01); *H01G 9/2068* (2013.01); *H01L 31/18* (2013.01); *H01G 9/2031* (2013.01); *H01G 9/2059* (2013.01); *H01L 51/445* (2013.01); *Y02E 10/542* (2013.01)

(58) Field of Classification Search
USPC .......................................................... 427/74
See application file for complete search history.

(56) References Cited

U.S. PATENT DOCUMENTS

| | | | |
|---|---|---|---|
| 2009/0235982 A1* | 9/2009 | Okada et al. .................. | 136/256 |
| 2010/0126565 A1* | 5/2010 | Takeda et al. ................. | 136/252 |

(Continued)

FOREIGN PATENT DOCUMENTS

| | | |
|---|---|---|
| EP | 2 249 429 A1 | 11/2010 |
| JP | 2006-261089 A | 9/2006 |
| JP | 2008-177022 A | 7/2008 |

(Continued)

OTHER PUBLICATIONS

International Search Report for PCT/JP2011/063762 dated Aug. 2, 2011.

(Continued)

*Primary Examiner* — Robert Vetere
(74) *Attorney, Agent, or Firm* — Sughrue Mion, PLLC

(57) ABSTRACT

The present invention is a production method of an electrode for a dye-sensitized solar cell, comprising: a first step of providing current collector wiring on an electrically conductive substrate; and a second step of producing an electrode for a dye-sensitized solar cell by sequentially forming a plurality of thermoplastic wiring protective layers on the current collector wiring so that softening points of the thermoplastic wiring protective layers become lower as the thermoplastic wiring protective layers move away from the current collector wiring, and by heat-treating the second and subsequent thermoplastic wiring protective layers from the current collector wiring at a heat treatment temperature lower than a softening point of the thermoplastic wiring protective layer formed immediately prior thereto.

4 Claims, 9 Drawing Sheets

(56) References Cited

U.S. PATENT DOCUMENTS

| | | |
|---|---|---|
| 2010/0229941 A1 | 9/2010 | Matsui et al. |
| 2011/0192458 A1* | 8/2011 | Doi et al. ............... 136/256 |

FOREIGN PATENT DOCUMENTS

| | | |
|---|---|---|
| JP | 2008-226553 A | 9/2008 |
| WO | 2009/069551 A1 | 6/2009 |
| WO | 2009/098857 A1 | 8/2009 |
| WO | 2010/050207 A1 | 5/2010 |

OTHER PUBLICATIONS

Japanese Office Action dated Sep. 24, 2013 issued in Patent Application No. 2012-520485.

Chinese Office Action issued Jun. 11, 2014 in Chinese Patent Application No. 201180021889.6.

* cited by examiner

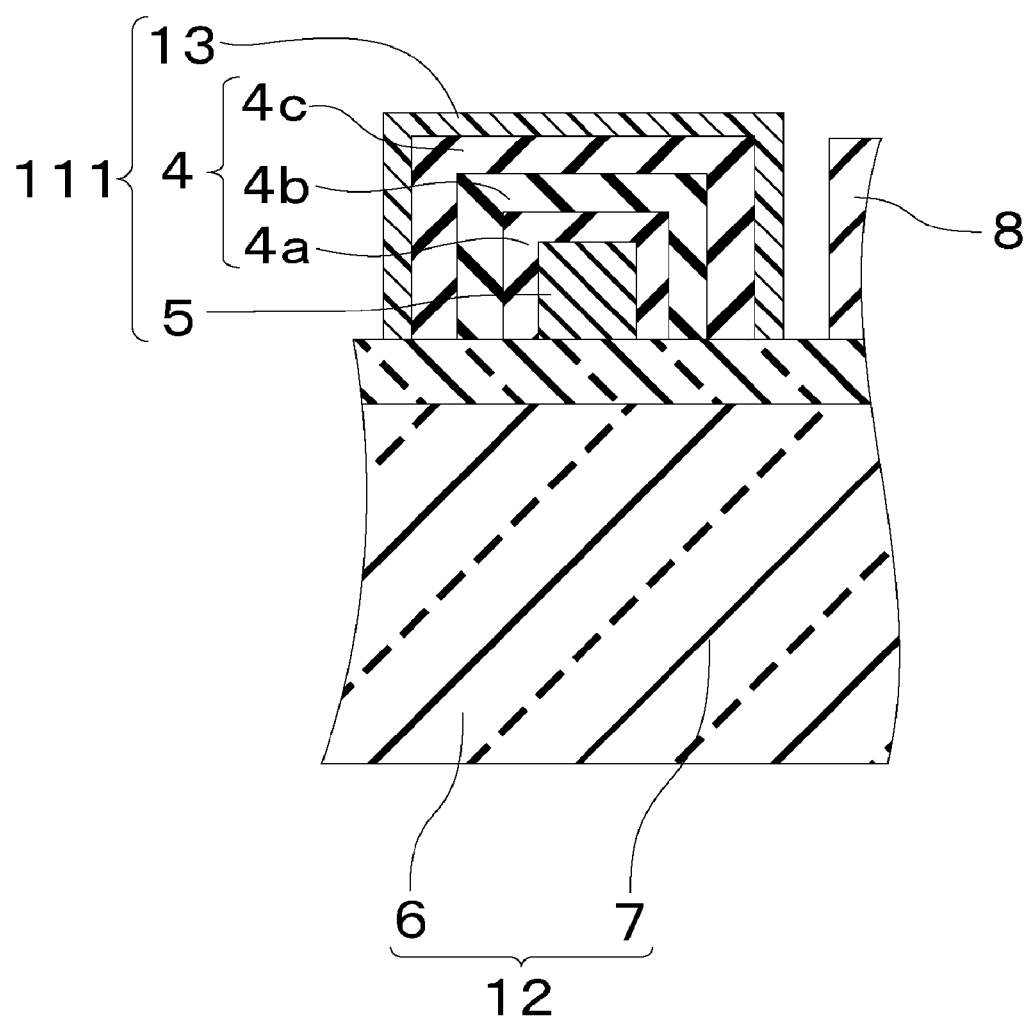

ELECTRODE FOR DYE-SENSITIZED SOLAR CELL, PRODUCTION METHOD OF SAME AND DYE-SENSITIZED SOLAR CELL

CROSS REFERENCE TO RELATED APPLICATIONS

This application is a Continuation of National Stage of International Application No. PCT/JP2011/63762 filed Jun. 16, 2011, claiming priority based on Japanese Patent Application No. 2010-137769 filed Jun. 16, 2010, the contents of all of which are incorporated herein by reference in their entirety.

TECHNICAL FIELD

The present invention relates to an electrode for a dye-sensitized solar cell, a production method of the same, and a dye-sensitized solar cell.

BACKGROUND ART

Dye-sensitized solar cells are attracting attention as photoelectric conversion devices since they are inexpensive and allow the obtaining of high photoelectric conversion efficiency, and a wide range of development has been conducted on dye-sensitized solar cells.

Dye-sensitized solar cells are typically provided with a working electrode, a counter electrode, a photosensitizing dye adsorbed on the working electrode, an encapsulating portion that connects the working electrode and the counter electrode, and an electrolyte arranged in a space (cell space) surrounded by the working electrode, the counter electrode and the sealing portion.

Here, the working electrode typically has current collector wiring on a transparent electrically conductive layer in order to efficiently extract electricity obtained in a porous oxide semiconductor layer to the outside. Moreover, the current collector wiring is typically coated with a wiring protective layer to prevent corrosion of the current collector wiring by the electrolyte.

A dye-sensitized solar cell has been proposed for use as this type of dye-sensitized solar cell that has an adequate wiring protective function by sequentially coating current collector wiring with a laminate consisting of a plurality of low melting point glass layers and an insulating resin layer such as polyimide (Patent Document 1).

PRIOR ART DOCUMENTS

Patent Documents

Patent Document 1: WO 2009/069551

SUMMARY OF THE INVENTION

Problems to be Solved by the Invention

However, even in the case of the dye-sensitized solar cell described in the above-mentioned Patent Document 1, there was still room for improvement with respect to inhibiting corrosion of the current collector wiring by the electrolyte.

With the foregoing in view, an object of the present invention is to provide an electrode for a dye-sensitized solar cell capable of adequately inhibiting corrosion of current collector wiring by electrolyte, a production method thereof, and a dye-sensitized solar cell.

Means for Solving the Problems

The inventors of the present invention conducted extensive studies on the cause of the above-mentioned problem. As a result, the inventors of the present invention thought that the cause may be due to the occurrence of the following phenomenon during sequential coating of the current collector wiring with a plurality of low melting point glass layers. Namely, the inventors of the present invention thought that, when forming the second and subsequent low melting point glass layers, the low melting point glass layer formed immediately prior thereto ends up melting, and voids and cracks present in the previously formed low melting point glass layer join with voids and cracks present in the low melting point glass layer currently being formed, thereby allowing the voids and cracks to grow into voids and cracks that penetrate the plurality of low melting point glass layers. As a result, the inventors of the present invention thought that electrolyte that has permeated the insulating resin layer reaches the current collector wiring by passing through the voids and cracks, thereby resulting in corrosion of the current collector wiring. Therefore, as a result of further conducting extensive studies, the inventors of the present invention found that the above-mentioned problem can be solved by the invention described below.

Namely, the present invention is a production method of an electrode for a dye-sensitized solar cell, comprising: a first step of providing current collector wiring on an electrically conductive substrate, and a second step of producing an electrode for a dye-sensitized solar cell by sequentially forming a plurality of thermoplastic wiring protective layers on the current collector wiring so that softening points of the thermoplastic wiring protective layers become lower as the thermoplastic wiring protective layers move away from the current collector wiring, and by heat-treating the second and subsequent thermoplastic wiring protective layers from the current collector wiring at a heat treatment temperature lower than a softening point of the thermoplastic wiring protective layer formed immediately prior thereto.

According to this production method of an electrode for a dye-sensitized solar cell, when forming the second and subsequent thermoplastic wiring protective layers from the current collector wiring among a plurality of thermoplastic wiring protective layers, since the thermoplastic wiring protective layers are formed at a heat treatment temperature lower than the softening point of the thermoplastic wiring protective layer formed immediately prior thereto, the migration of voids and cracks in the thermoplastic wiring protective layer formed immediately prior thereto and the joining of those voids and cracks with the voids and cracks present in the thermoplastic wiring protective layer being formed can be prevented. Consequently, the formation of voids and cracks that penetrate the plurality of thermoplastic wiring protective layers can be adequately inhibited. As a result, in the case of using the electrode of the present invention as an electrode of a dye-sensitized solar cell, an electrode can be produced that is capable of adequately inhibiting corrosion of current collector wiring by electrolyte that has permeated through voids and cracks.

In addition, the present invention is an electrode for a dye-sensitized solar cell that is obtained according to the above-mentioned production method of an electrode for a dye-sensitized solar cell.

According to this electrode for a dye-sensitized solar cell, when forming the second and subsequent thermoplastic wiring protective layers from the current collector wiring among a plurality of thermoplastic wiring protective layers, since the thermoplastic wiring protective layers are formed at a heat treatment temperature lower than the softening point of the thermoplastic wiring protective layer formed immediately prior thereto, the migration of voids and cracks in the thermoplastic wiring protective layer formed immediately prior thereto and the joining of those voids and cracks with the voids and cracks present in the thermoplastic wiring protective layer being formed can be prevented. Consequently, the formation of voids and cracks that penetrate the plurality of thermoplastic wiring protective layers can be adequately inhibited. As a result, in the case of using the electrode for a dye-sensitized solar cell of the present invention as an electrode of a dye-sensitized solar cell, corrosion of current collector wiring by electrolyte that has permeated through voids and cracks can be adequately inhibited.

In addition, the present invention is an electrode for a dye-sensitized solar cell provided with an electrically conductive substrate, current collector wiring provided on the electrically conductive substrate, and a plurality of thermoplastic wiring protective layers provided on the current collector wiring, wherein, in the plurality of thermoplastic wiring protective layers, the softening points of the thermoplastic wiring protective layers become lower as the thermoplastic wiring protective layers move away from the current collector wiring.

According to this electrode for a dye-sensitized solar cell, in the plurality of thermoplastic wiring protective layers, the softening points of the thermoplastic wiring protective layers become lower as the thermoplastic wiring protective layers move away from the current collector wiring. Namely, the plurality of thermoplastic wiring protective layers has mutually different softening points. Consequently, an interface is present between adjacent thermoplastic wiring protective layers. Consequently, even if voids and cracks form in one of adjacent thermoplastic wiring protective layers, the voids and cracks are interrupted at the interface thereof. Namely, those voids and cracks can be prevented from being formed by extending to the adjacent thermoplastic wiring protective layer. As a result, the formation of voids and cracks that penetrate the plurality of thermoplastic wiring protective layers is adequately inhibited. In addition, during and after production of a dye-sensitized solar cell using the electrode of the present invention, even if the electrode is placed in a high-temperature environment (even if an encapsulating portion is formed), since a thermoplastic wiring protective layer farther from the current collector wiring has a lower softening point, heat is first absorbed by that thermoplastic wiring protective layer having a low softening point, thereby making it difficult for heat to reach the thermoplastic wiring protective layer close to the current collector wiring. Consequently, softening of the thermoplastic wiring protective layer closer to the current collector wiring can be adequately inhibited. Thus, even if voids and cracks are formed in the plurality of thermoplastic wiring protective layers, the joining of these voids and cracks to form voids and cracks that penetrate the plurality of thermoplastic wiring protective layers can be adequately inhibited. Accordingly, when the electrode of the present invention is used as an electrode of a dye-sensitized solar cell, even if the thermoplastic wiring protective layers of the electrode make contact with electrolyte, corrosion of the current collector wiring by electrolyte that has permeated those voids and cracks can be adequately inhibited.

It is preferable that the above-mentioned plurality of thermoplastic wiring protective layers have at least two thermoplastic wiring protective layers of which main components are formed of the same material, and that these thermoplastic wiring protective layers be adjacent to each other.

In this case, since the main components of adjacent thermoplastic wiring protective layers are the same, adhesion between these thermoplastic wiring protective layers can be increased, the formation of gaps between these thermoplastic wiring protective layers can be adequately inhibited, and it can be more adequately inhibited that the gaps connect voids and cracks formed in adjacent thermoplastic wiring protective layers respectively and pathways of entry of electrolyte spanning the plurality of thermoplastic wiring protective layers are formed.

Specifically, the above-mentioned plurality of thermoplastic wiring protective layers have at least two thermoplastic wiring protective layers of which main components are formed of a glass component, the main component of each of the mutually adjacent thermoplastic wiring protective layers is a glass component, and the thermoplastic wiring protective layers are glass frit protective layers.

In addition, the above-mentioned electrode may be further provided with an insulating resin layer that covers the plurality of thermoplastic wiring protective layers, and in the above-mentioned electrode production method, the above-mentioned second step may also include a step of forming the electrode by covering the plurality of thermoplastic wiring protective layers with an insulating resin layer after having formed the plurality of thermoplastic wiring protective layers.

In this case, even in the case the plurality of thermoplastic wiring protective layers have glass frit protective layers having a glass component as a main component thereof, damage to the surface of the opposing electrode is adequately inhibited by the insulating resin layer.

In the above-mentioned electrode production method and the above-mentioned electrode, the softening point of the first thermoplastic wiring protective layer from the current collector wiring is preferably 420° C. to 590° C.

In this case, if the softening point of the first thermoplastic wiring protective layer is within the above-mentioned range, in comparison with being outside that range, joining of voids and cracks in the first thermoplastic wiring protective layer with voids and cracks in the second and subsequent thermoplastic wiring protective layers when forming the second and subsequent thermoplastic wiring protective layers is more adequately inhibited, and corrosion of the current collector wiring by electrolyte is more adequately inhibited.

In the above-mentioned electrode production method and the above-mentioned electrode, the difference in softening points between adjacent thermoplastic wiring protective layers is preferably 10° C. to 100° C. In this case, in comparison with the case of the difference in softening points between adjacent thermoplastic wiring protective layers being outside the above-mentioned range, joining of voids and cracks in the first thermoplastic wiring protective layer with voids and cracks in the second and subsequent thermoplastic wiring protective layers when forming the second and subsequent thermoplastic wiring protective layers is more adequately inhibited, and corrosion of the current collector wiring by electrolyte is more adequately inhibited.

In addition, the present invention is a dye-sensitized solar cell provided with a pair of electrodes and an electrolyte provided between the pair of electrodes, wherein one of the pair of electrodes is the above-mentioned electrode for a dye-sensitized solar cell.

According to the above-mentioned electrode, the formation of voids and cracks penetrating the plurality of thermoplastic wiring protective layers is adequately inhibited. Consequently, according to a dye-sensitized solar cell having this electrode as one of a pair of electrodes thereof, corrosion of the current collector wiring by electrolyte entering through the voids and cracks is adequately inhibited, and electricity generated with the dye-sensitized solar cell can be extracted efficiently.

Furthermore, in the present invention, "heat treatment" refers to "baking" in the case the thermoplastic wiring protective layers are glass frit layers containing a glass component as the main component thereof, or refers to "melting" in the case the thermoplastic wiring protective layers are made of a thermoplastic resin. In addition, "heat treatment temperature" refers to the average value of temperature while the time heat treatment is carried out, and specifically, refers to a value obtained by averaging measured values obtained by measuring the temperature of a thermocouple installed in a target of heat treatment in the form of a thermoplastic wiring protective layer or precursor thereof at one minute intervals.

In addition, in the present invention, "main component" refers to a component contained in the thermoplastic wiring protective layers at a ratio of 50% by mass or more.

In addition, softening point refers to the softening point measured using dye-sensitized solar cell at a rate of temperature increase of 5° C./min.

Effects of the Invention

According to the present invention, an electrode for a dye-sensitized solar cell capable of adequately inhibiting corrosion of current collector wiring by electrolyte, a production method thereof, and a dye-sensitized solar cell are provided.

BRIEF DESCRIPTION OF THE DRAWINGS

FIG. 9 is a partial cross-sectional view showing a variation of the working electrode of FIG. 1.

MODES FOR CARRYING OUT THE INVENTION

Figure 1:
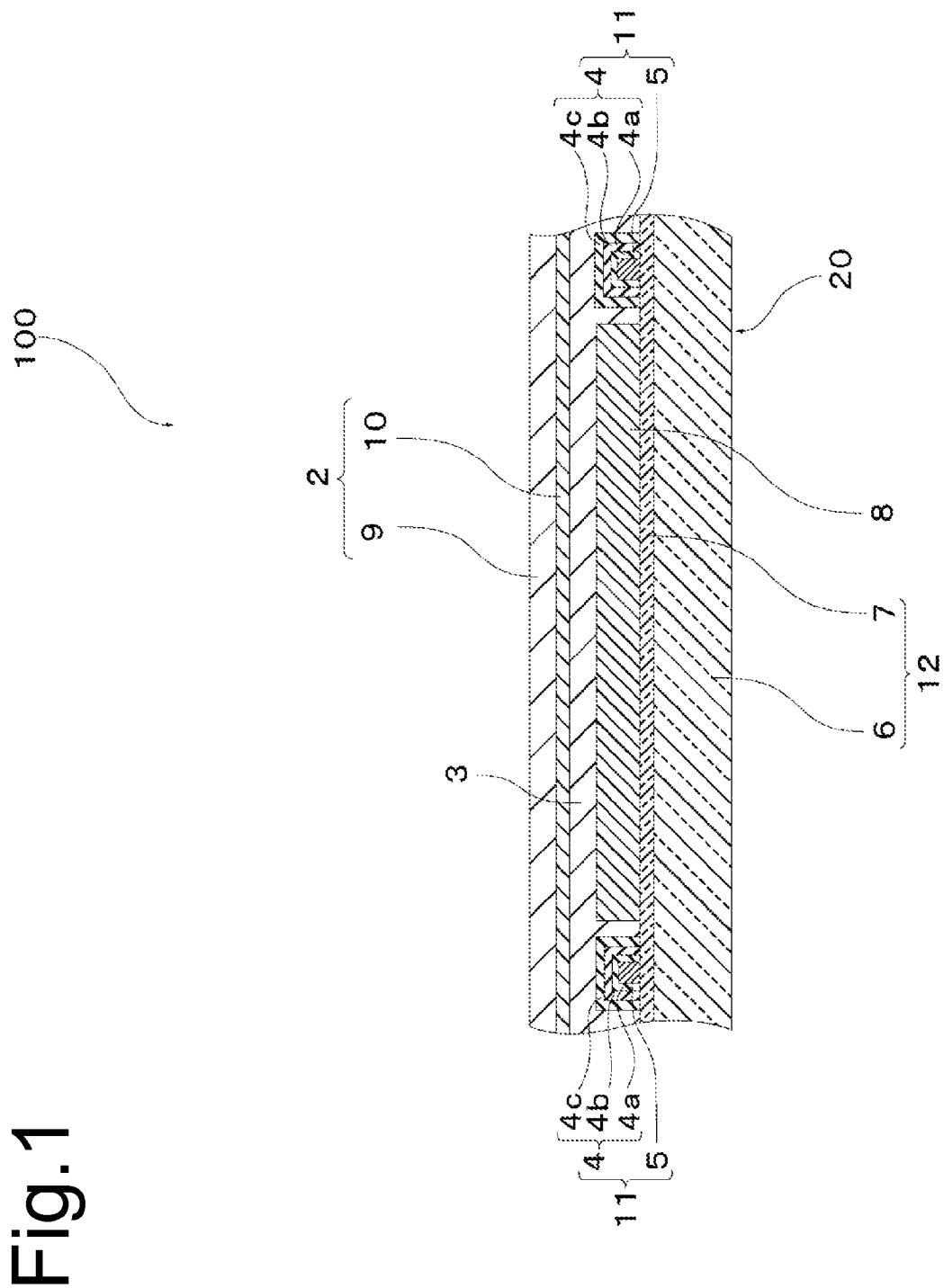
FIG. 1 is partial cross-sectional view showing an embodiment of a dye-sensitized solar cell according to the present invention.

The following provides an explanation of embodiments of a dye-sensitized solar cell according to the present invention using the drawings. FIG. 1 is a partial cross-sectional view showing an embodiment of a dye-sensitized solar cell according to the present invention, and FIG. 2 is a partial cross-sectional view showing the working electrode of FIG. 1.

As shown in FIG. 1, a dye-sensitized solar cell 100 is provided with a working electrode 20, and a counter electrode 2 arranged so as to oppose the working electrode 20. A photosensitizing dye is adsorbed on the working electrode 20. The working electrode 20 and the counter electrode 2 are connected by an encapsulating portion (not shown). An electrolyte 3 is filled into a cell space surrounded by the working electrode 20, the counter electrode 2 and the encapsulating portion.

Figure 2:
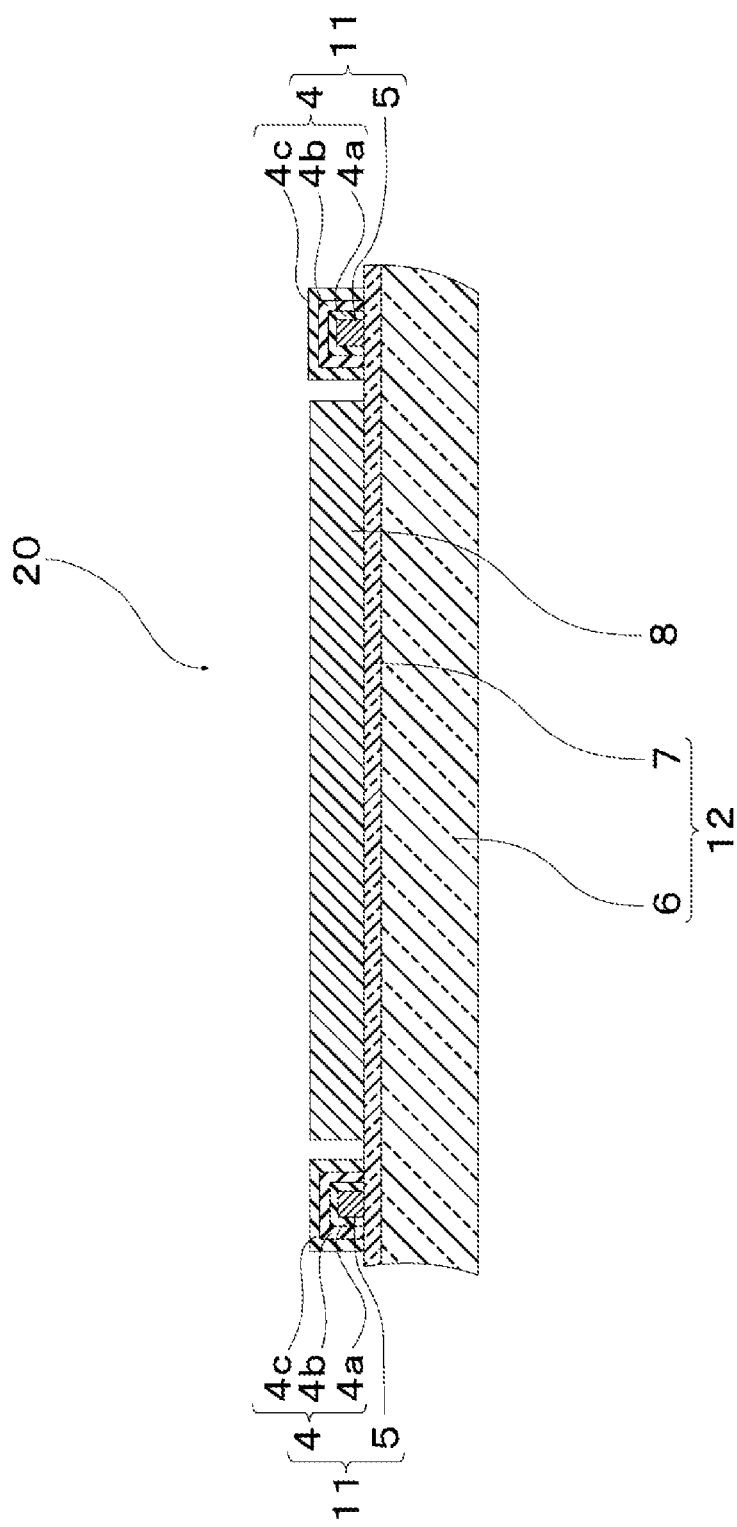
FIG. 2 is a partial cross-sectional view showing the working electrode of FIG. 1.

As shown in FIG. 2, the working electrode 20 is provided with an electrically conductive substrate 12, a porous oxide semiconductor layer 8 provided on the electrically conductive substrate 12, and a wiring portion 11 provided so as to surround the porous oxide semiconductor layer 8. The electrically conductive substrate 12 is provided with a transparent substrate 6 and a transparent electrically conductive layer 7 provided on the transparent substrate 6 on the side of the counter electrode 2 so as to contact the porous oxide semiconductor layer 8. The wiring portion 11 is provided with current collector wiring 5, provided so as to surround the porous oxide semiconductor layer 8 on the transparent electrically conductive layer 7, and a wiring protective layer 4 that covers the current collector wiring 5. Here, the wiring protective layer 4 is formed of a plurality of thermoplastic wiring protective layers 4a, 4b and 4c. The thermoplastic wiring protective layers 4a to 4c are formed so that their softening points become lower as the thermoplastic wiring protective layers 4a to 4c move away from the current collector wiring 5. Namely, among the plurality of thermoplastic wiring protective layers 4a to 4c, the softening point of the thermoplastic wiring protective layer 4a is the highest, and the softening point of the thermoplastic wiring protective layer 4c is the lowest. The thermoplastic wiring protective layer 4b has a softening point between the softening point of the thermoplastic wiring protective layer 4a and the softening point of the thermoplastic wiring protective layer 4c. In the present embodiment, the thermoplastic wiring protective layers 4a to 4c are respectively glass frit protective layers having glass as a main component thereof. In the present embodiment, the thermoplastic wiring protective layer 4c is the outermost layer of the wiring protective layer 4, and makes contact with the electrolyte 3.

A photosensitizing dye is adsorbed on the porous oxide semiconductor layer 8 of the working electrode 20. In addition, as shown in FIG. 1, the counter electrode 2 is provided with a counter electrode substrate 9 and an electrically conductive catalyst layer 10 provided on the counter electrode substrate 9 on the side of the working electrode 20 that accelerates a reduction reaction on the surface of the counter electrode 2.

The encapsulating portion connects the working electrode 20 and the counter electrode 2. In addition to being fixed on the surface of the working electrode 20 on the side of the porous oxide semiconductor layer 8, or in other words, on the surface of the transparent electrically conductive layer 7, the encapsulating portion is fixed on the surface of the catalyst layer 10 of the counter electrode 2.

According to the dye-sensitized solar cell 100, in the thermoplastic wiring protective layers 4a, 4b and 4c, the softening points of the thermoplastic wiring protective layers become lower as the thermoplastic wiring protective layers 4a, 4b and 4c move away from the current collector wiring 5. Namely, the thermoplastic wiring protective layers 4a, 4b and 4c have mutually different softening points. Consequently, an interface is present between adjacent thermoplastic wiring protective layers. Consequently, even if voids and cracks form in one of the thermoplastic wiring protective layers of the adjacent thermoplastic wiring protective layers 4a and 4b, for example, voids and cracks at the interface of the adjacent thermoplastic wiring protective layers 4a and 4b can be interrupted. Namely, voids and cracks in the thermoplastic wiring protective layer 4a can be prevented from being formed by extending to the adjacent thermoplastic wiring protective layer 4b. As a result, the formation of voids and cracks that penetrate the thermoplastic wiring protective layers 4a to 4c is adequately inhibited. In addition, in the dye-sensitized solar cell 100, a thermoplastic wiring protective layer farther from the current collector wiring 5 has a lower softening point. Consequently, even if the working electrode 20 is placed in a high-temperature environment as a result of the dye-sensitized solar cell 100 having been placed in a high-temperature environment, heat is first absorbed by the thermoplastic wiring protective layer having a low softening point, thereby making it difficult for heat to reach the thermoplastic wiring protective layer close to the current collector wiring 5. Consequently, softening of the thermoplastic wiring protective layer closer to the current collector wiring 5 can be adequately inhibited. Thus, even if voids and cracks are formed in each of the thermoplastic wiring protective layers 4a, 4b and 4c, the joining of these voids and cracks to form voids and cracks that penetrate the thermoplastic wiring protective layers 4a, 4b and 4c can be adequately inhibited.

Accordingly, even if the thermoplastic wiring protective layer 4c of the working electrode 20 makes contact with the electrolyte 3, corrosion of the current collector wiring 5 caused by entry of the electrolyte 3 through the voids and cracks can be adequately inhibited and electricity can be efficiently extracted.

The following provides an explanation of a production method of the above-mentioned dye-sensitized solar cell 100 with reference to FIGS. 3 to 8. FIGS. 3 to 8 are drawings showing a series of steps used to produce a working electrode.

[Preparation Step]

First, the working electrode 20 and the counter electrode 2 are prepared.

(Working Electrode)

The working electrode 20 can be obtained in the manner described below.

To begin with, the transparent electrically conductive layer 7 is formed on the transparent substrate 6. Sputtering, vapor deposition, spray pyrolysis deposition (SPD) or Chemical Vapor Deposition and the like are used to form the transparent electrically conductive layer 7. Among these, spray pyrolysis deposition is preferable from the viewpoint of equipment costs.

The material that composes the transparent substrate 6 is, for example, a transparent material, and examples of such transparent materials include glass such as borosilicate glass, soda lime glass, glass which is made of soda lime and whose iron component is less than that of ordinary soda lime glass, or quartz glass, polyethylene terephthalate (PET), polyethylene naphthalate (PEN), polycarbonate (PC) and polyether sulfone (PES). The thickness of the transparent substrate 6 is suitably determined corresponding to the size of the dye-sensitized solar cell 100, and although there are no particular limitations thereon, it is within the range of, for example, 50 μm to 10000 μm.

Examples of the material that composes the transparent electrically conductive layer 7 include electrically conductive metal oxides such as indium tin oxide (ITO), tin oxide ($SnO_2$) or fluorine-doped tin oxide (FTO). The transparent electrically conductive layer 7 may also be formed of a single layer or a laminate of a plurality of layers composed with different electrically conductive metal oxides. In the case the transparent electrically conductive layer 7 is formed of a single layer, the transparent electrically conductive layer 7 is preferably formed of FTO since it has high heat resistance and chemical resistance. In addition, a laminate formed of a plurality of layers is preferably used for the transparent electrically conductive layer 7. In this case, the characteristics of each layer can be reflected. In particular, the use of a laminate of a layer made of ITO and a layer made of FTO is preferable. In this case, the transparent electrically conductive layer 7 can be realized that has high electrical conductivity, high heat resistance and high chemical resistance. The thickness of the transparent electrically conductive layer 7 is within the range of, for example, 0.01 μm to 2 μm.

Next, a paste for forming a porous oxide semiconductor layer is printed onto the transparent electrically conductive layer 7. The paste for forming the porous oxide semiconductor layer contains a resin such as polyethylene glycol and a solvent such as terpineol in addition to oxide semiconductor particles. Examples of methods that can be used to print the paste for forming the porous oxide semiconductor layer include screen printing, doctor blade coating and bar coating.

Next, the paste for forming the porous oxide semiconductor layer is baked to form the porous oxide semiconductor layer 8 on the transparent electrically conductive layer 7 (see FIG. 2). Although varying according to the oxide semiconductor particles, the baking temperature is normally 140° C. to 600° C., and although also varying according to the oxide semiconductor particles, the baking time is normally 1 hour to 5 hours.

Examples of the above-mentioned oxide semiconductor particles include titanium oxide ($TiO_2$), zinc oxide (ZnO), tungsten oxide ($WO_3$), niobium oxide ($Nb_2O_3$), strontium titanate ($SrTiO_3$), tin oxide ($SnO_2$), indium oxide ($In_3O_3$), zirconium oxide ($ZrO_2$), thallium oxide ($Ta_2O_5$), lanthanum oxide ($La_2O_3$), yttrium oxide ($Y_2O_3$), holmium oxide ($Ho_2O_3$), bismuth oxide ($Bi_2O_3$), cerium oxide ($CeO_2$), aluminum oxide ($Al_2O_3$) and oxide semiconductor particles formed of two or more types thereof. The mean particle diameter of these oxide semiconductor particles is preferably 1 nm to 1000 nm. In this case, the surface area of the oxide semiconductor covered with dye increases. Namely, the size of sites where photoelectric conversion takes place increases. As a result, a larger number of electrons can be generated. Here, the porous oxide semiconductor layer 8 is preferably formed of laminate obtained by laminating oxide semiconductor particles having different particle size distributions. In this case, light is able to be repeatedly reflected within the laminate, and light can be efficiently converted to electrons without allowing incident light to escape outside the laminate. The thickness of the porous oxide semiconductor layer 8 is, for example, 0.5 μm to 50 μm. Furthermore, the porous oxide semiconductor layer 8 can also be composed with a laminate consisting of a plurality of semiconductor layers made of different materials.

Figure 3:
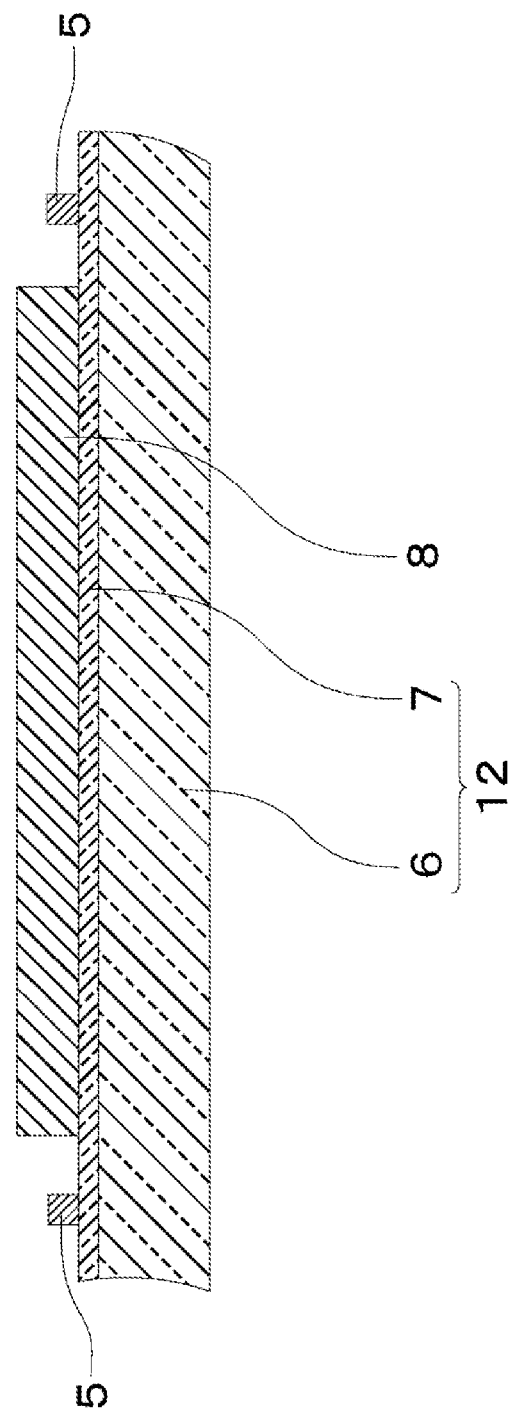
FIG. 3 is a drawing showing one step of a production method of the working electrode of FIG. 1.

Next, as shown in FIG. 3, the collector current wiring 5 is formed so as to surround the porous oxide semiconductor layer 8 (Step 1), and the current collector wiring 5 is covered with the wiring protective layer 4 (Step 2). The following provides a detailed explanation of the method used to form the wiring protective layer 4.

Figure 4:
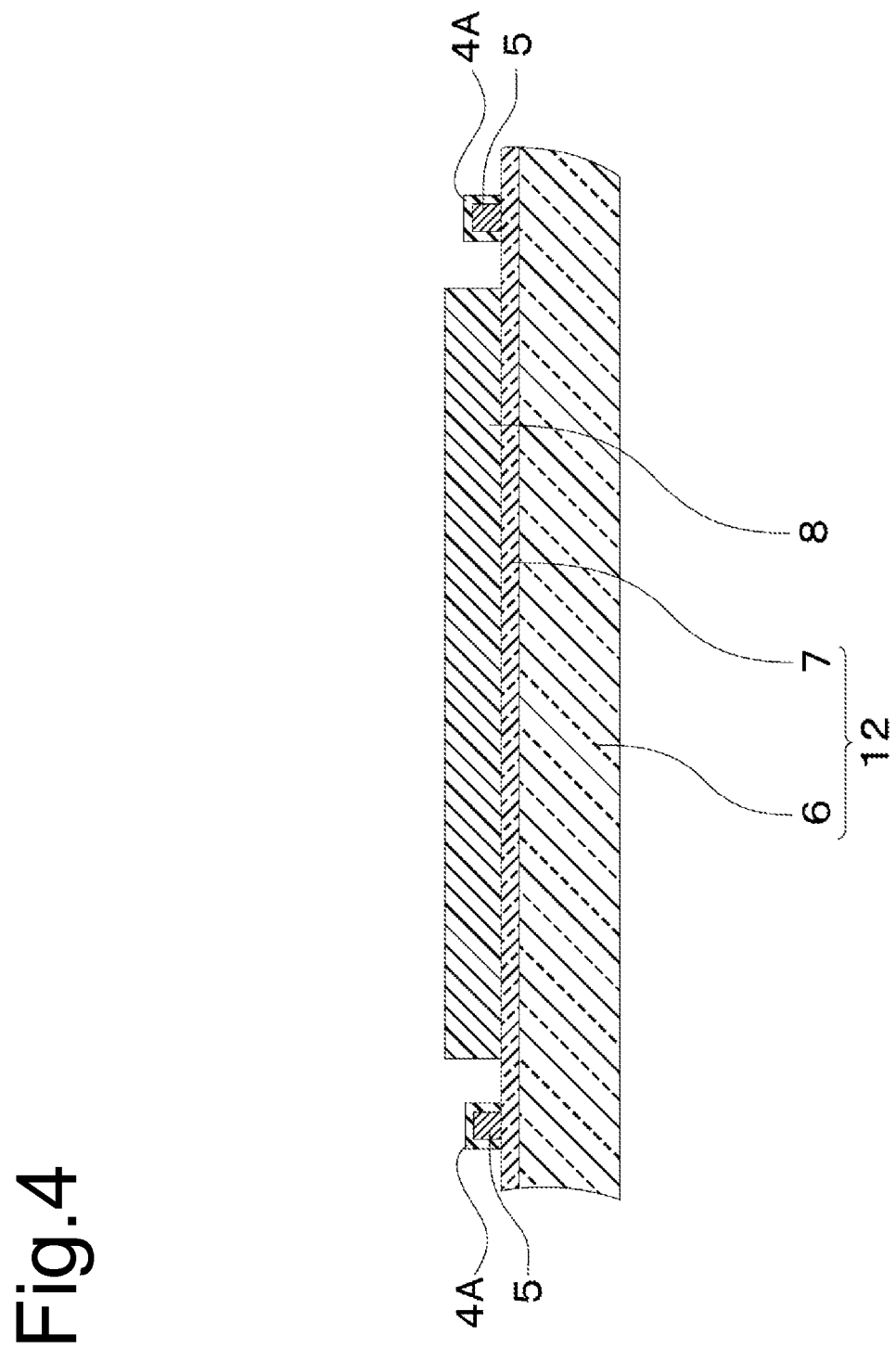
FIG. 4 is a drawing showing one step of a production method of the working electrode of FIG. 1.
Figure 5:
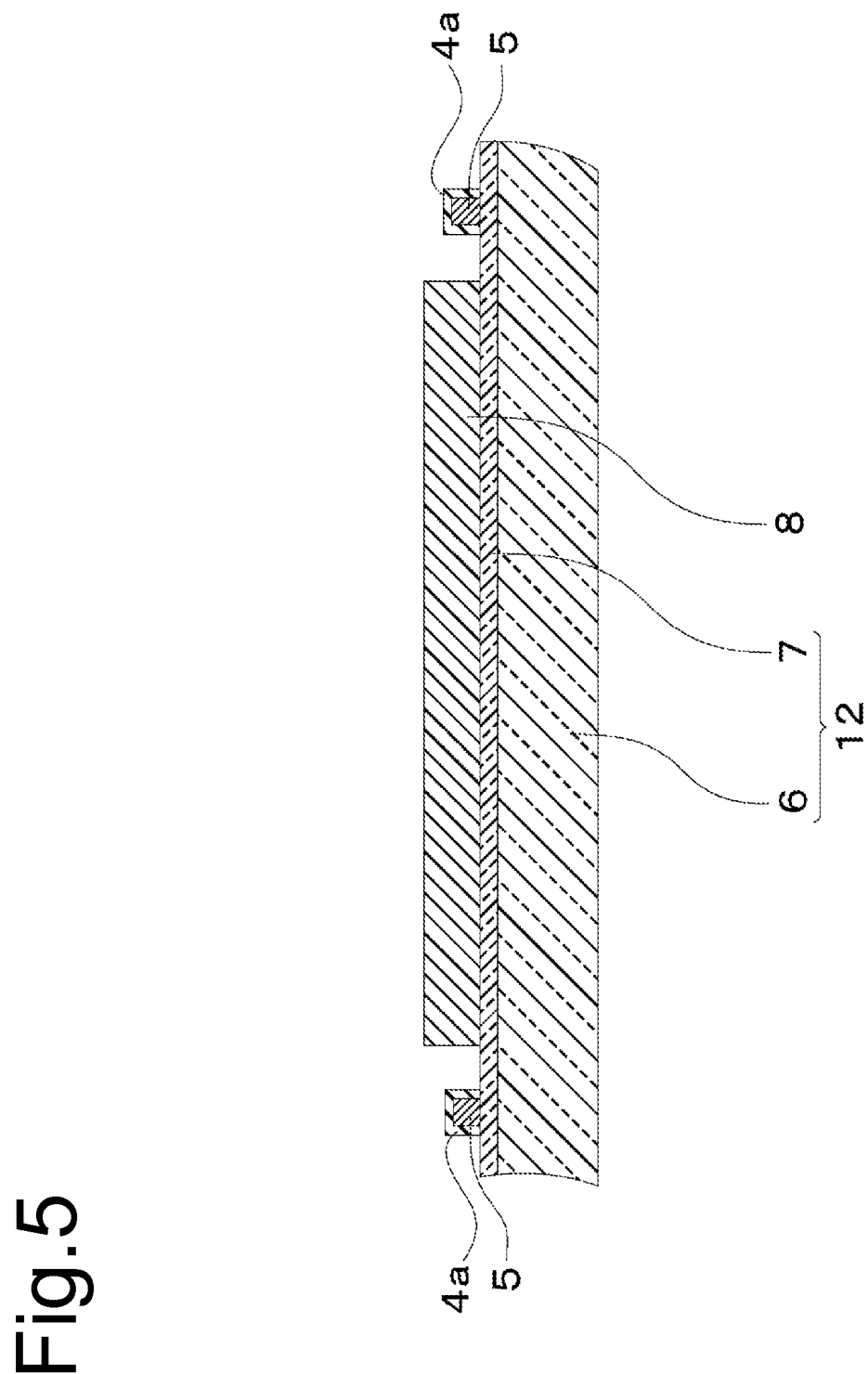
FIG. 5 is a drawing showing one step of a production method of the working electrode of FIG. 1.

First, in the present embodiment as was previously described, the thermoplastic wiring protective layer 4a is a glass frit protective layer having glass as the main component thereof. Consequently, a glass paste is prepared that is mainly made of glass and is obtained by adding a plasticizer and other additives as necessary in order to adjust coefficient of thermal expansion, viscosity and the like. Continuing, as shown in FIG. 4, this glass paste 4A is coated so as to cover the current collector wiring 5 by a method such as screen printing or dispensing. Subsequently, the above-mentioned glass paste 4A is baked. In this manner, the thermoplastic wiring protective layer 4a is obtained that covers the current collector wiring 5 (FIG. 5). Here, examples of glass components include lead borate glass, bismuth borosilicate glass, aluminophosphate glass and zinc phosphate glass. The softening point of the thermoplastic wiring protective layer 4a is preferably 420° C. to 590° C. and more preferably 450° C. to 550° C. If the softening point of the thermoplastic wiring protective layer 4a is within the above-mentioned ranges, in comparison with being outside these ranges, joining of voids and cracks in the thermoplastic wiring protective layer 9a with voids and cracks in the thermoplastic wiring protective layers 4b and 4c when forming the thermoplastic wiring protective layers 4b and 4c is more adequately inhibited, and corrosion of the current collector wiring 5 by the electrolyte 3 is more adequately inhibited.

Figure 6:
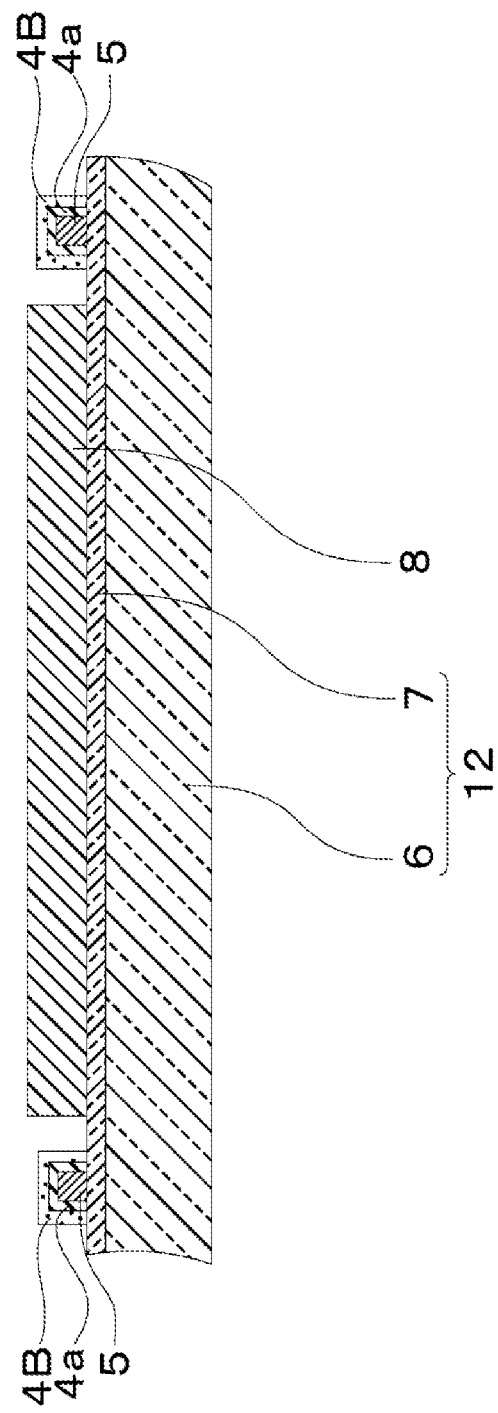
FIG. 6 is a drawing showing one step of a production method of the working electrode of FIG. 1.
Figure 7:
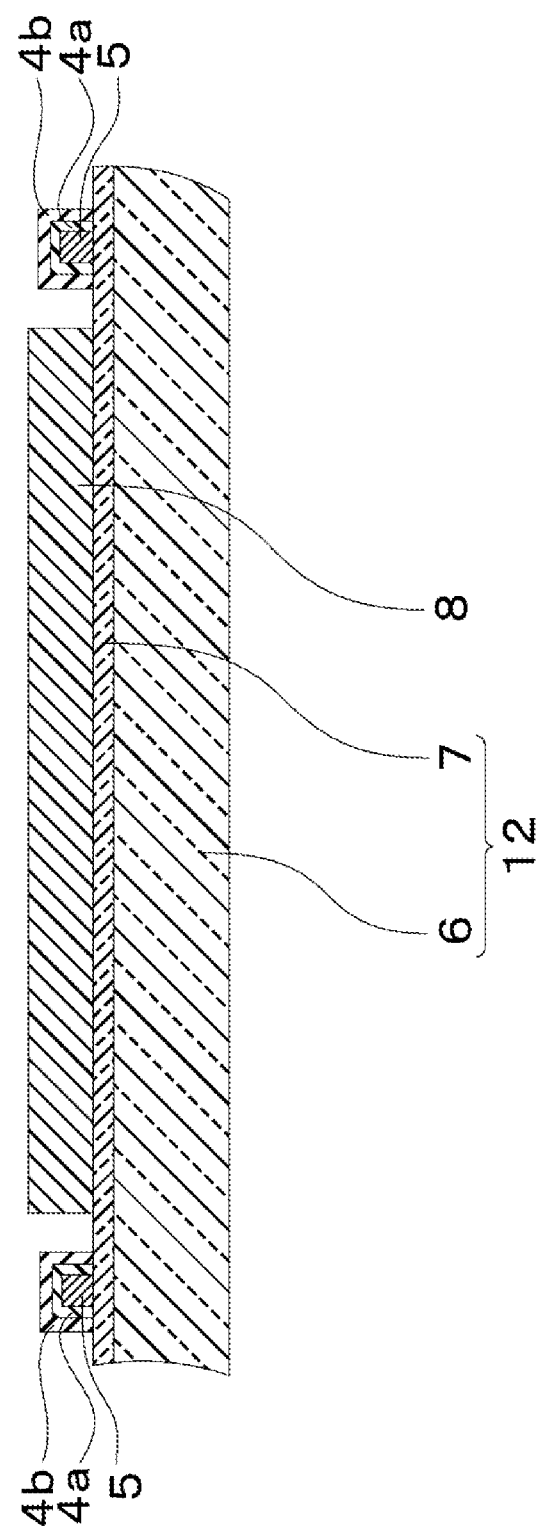
FIG. 7 is a drawing showing one step of a production method of the working electrode of FIG. 1.

Next, the second thermoplastic wiring protective layer 4b from the current collector wiring 5 is formed. In order to accomplish this, a glass paste for forming the thermoplastic wiring protective layer 4b is first prepared in the same manner as the thermoplastic wiring protective layer 4a, and as shown in FIG. 6, this glass paste 4B is coated so as to cover the thermoplastic wiring protective layer 4a by a method such as screen printing of dispensing. Subsequently, the above-mentioned glass paste 4B is baked. In this manner, the thermoplastic wiring protective layer 4b is obtained that covers the thermoplastic wiring protective layer 4a (FIG. 7). Here, although the glass component contained in the glass paste 4B may be the same as or different from the glass component used when forming the thermoplastic wiring protective layer 9a, the thermoplastic wiring protective layer 4b is made to have a softening point that is lower than that of the thermoplastic wiring protective layer 4a. For example, in the case the glass components of the thermoplastic wiring protective layers 4a and 4b are the same and are made of a complex oxide, the thermoplastic wiring protective layer 4b can be made to have a softening point lower than that of the thermoplastic wiring protective layer 4a by adjusting the blending ratio of each oxide that composes the complex oxide. Baking of the glass paste 4B is carried out at a baking temperature lower than the softening point of the thermoplastic wiring protective layer 4a formed immediately prior thereto. The baking temperature at this time is lower than the baking temperature used when forming the thermoplastic wiring protective layer 4a. Here, the difference between the baking temperature of the glass paste 4B and the softening point of the thermoplastic wiring protective layer 4a is preferably 5° C. or more and more preferably 10° C. or more. In this case, in comparison with the case of the difference between the baking temperature of the glass paste 4B and the softening point of the thermoplastic wiring protective layer 4a being less than 5° C., the thermoplastic wiring protective layer 4a is more resistant to melting. However, the difference between the baking temperature of the glass paste 4B and the softening point of the thermoplastic wiring protective layer 4a is preferably 100° C. or less and more preferably 50° C. or less.

Figure 8:
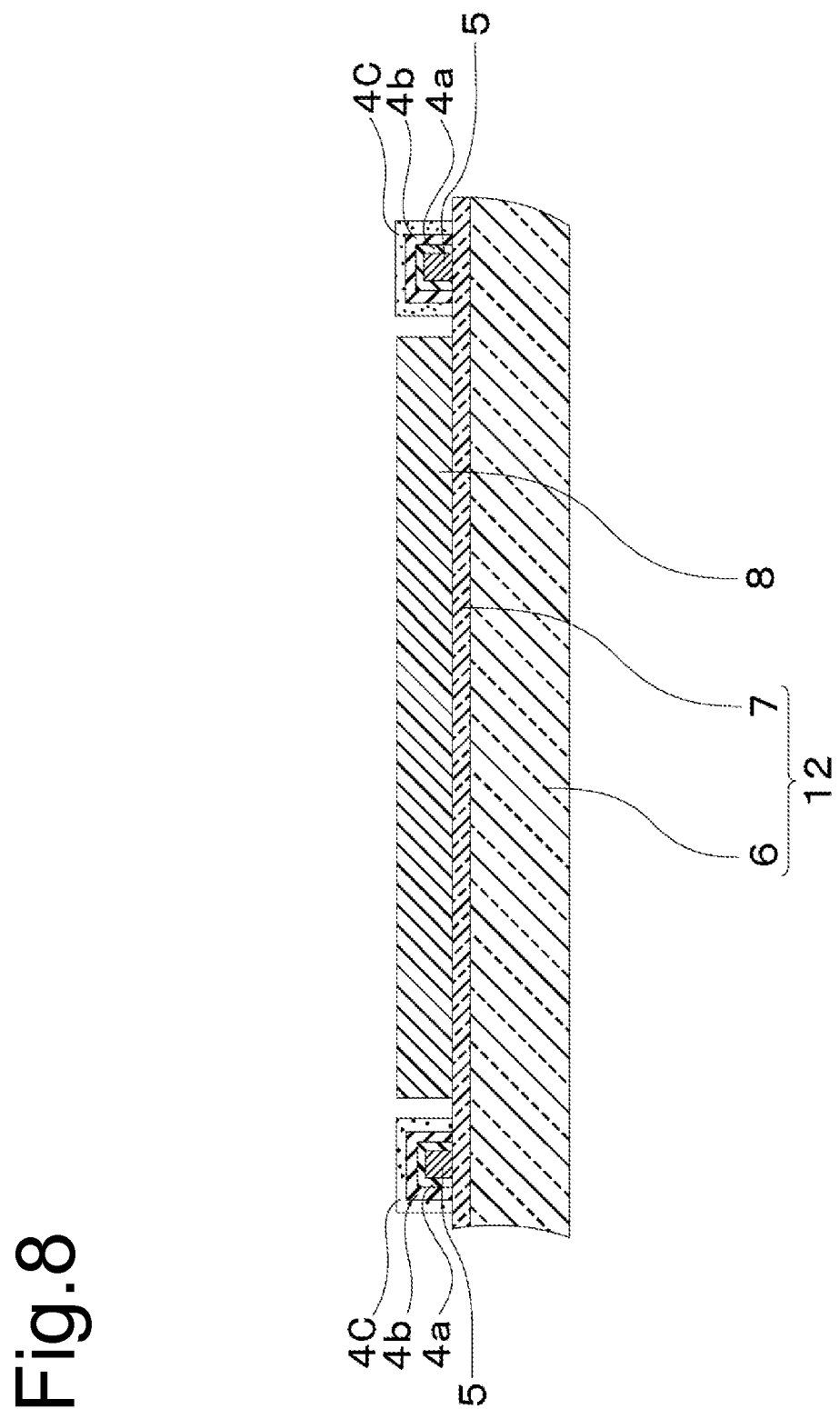
FIG. 8 is a drawing showing one step of a production method of the working electrode of FIG. 1.

Finally, the third thermoplastic wiring protective layer 4c from the current collector wiring 5 is formed. In order to accomplish this, a glass paste is first prepared in the same manner as the thermoplastic wiring protective layer 4b. As shown in FIG. 8, this glass paste 4C is coated so as to cover the thermoplastic wiring protective layer 4b by a method such as screen printing of dispensing. Subsequently, the above-mentioned glass paste 4C is baked. In this manner, the thermoplastic wiring protective layer 4c is obtained that covers the thermoplastic wiring protective layer 4b (FIG. 2). Here, although the glass component contained in the glass paste 40 may be the same as or different from the glass component used when forming the thermoplastic wiring protective layer 4b, the thermoplastic wiring protective layer 4c is made to have a softening point that is lower than that of the thermoplastic wiring protective layer 4b. For example, in the case the glass components of the thermoplastic wiring protective layers 4b and 4c are the same and are made of a complex oxide, the thermoplastic wiring protective layer 4c can be made to have a softening point lower than that of the thermoplastic wiring protective layer 4b by adjusting the blending ratio of each oxide that composes the complex oxide. Baking of the glass paste 4C is carried out at a baking temperature lower than the softening point of the thermoplastic wiring protective layer 4b formed immediately prior thereto. This baking temperature is lower than the baking temperature used when forming the thermoplastic wiring protective layer 4b. Here, the difference between the baking temperature of the glass paste 4C and the softening point of the thermoplastic wiring protective layer 4b is preferably 5° C. or more and more preferably 10° C. or more. In this case, in comparison with the case of the difference between the baking temperature of the glass paste 4C and the softening point of the thermoplastic wiring protective layer 4b being less than 5° C., the thermoplastic wiring protective layer 4b is more resistant to melting. However, the difference between the baking temperature of the glass paste 4C and the softening point of the thermoplastic wiring protective layer 4b is preferably 100° C. or less and more preferably 50° C. or less.

In addition, the difference in softening points between adjacent thermoplastic wiring protective layers is preferably 10° C. to 100° C. and more preferably 20° C. to 50° C. In this case, in comparison with the case of the difference in softening points between adjacent thermoplastic wiring protective layers being outside the above-mentioned ranges, joining of voids and cracks in the first thermoplastic wiring protective layer 4a with voids and cracks in the second and subsequent thermoplastic wiring protective layers 4b and 4c when forming the thermoplastic wiring protective layers 4b and 4c is more adequately inhibited, and corrosion of the current collector wiring 5 by the electrolyte 3 is more adequately inhibited.

Together with heat treating at a baking temperature lower than the softening point of the thermoplastic wiring protective layer 4a formed immediately prior thereto when forming the thermoplastic wiring protective layer 4b among the plurality of thermoplastic wiring protective layers 4a to 4c in the manner described above, by heat treating at a baking temperature lower than the softening point of the thermoplastic wiring protective layer 4b formed immediately thereto when forming the thermoplastic wiring protective layer 4c, the migration of voids and cracks in the thermoplastic wiring protective layer formed immediately prior thereto and the joining of those voids and cracks with the voids and cracks present in the thermoplastic wiring protective layer being formed can be prevented. As a result, the formation of voids and cracks that penetrate the plurality of thermoplastic wiring protective layers 4a to 4c can be adequately inhibited.

In addition, although the main components of the thermoplastic wiring protective layers 4a to 4c may be mutually different glass components in the present embodiment, at least two adjacent thermoplastic wiring protective layers preferably contain the same main components from the viewpoint of improving adhesion. In this case, adhesion between the adjacent thermoplastic wiring protective layers 4a to 4c increases, the formation of gaps between the thermoplastic wiring protective layers 4a to 4c can be adequately inhibited, and it can be more adequately inhibited that the gaps connect voids and cracks formed in adjacent thermoplastic wiring protective layers 4a to 4c respectively and pathways of entry of the electrolyte 3 spanning the plurality of thermoplastic wiring protective layers 4a to 4c are formed.

(Counter Electrode)

On the other hand, the counter electrode 2 can be obtained in the manner described below.

Namely, the counter electrode substrate 9 is first prepared. The catalyst layer 10 is then formed on the counter electrode substrate 9. Sputtering or vapor deposition and the like are used to form the catalyst layer 10. Among these, sputtering is preferable from the viewpoint of layer uniformity.

The counter electrode substrate 9 is made of a corrosion-resistant metal material such as titanium, nickel, platinum, molybdenum or tungsten, a material obtained by forming a layer made of an electrically conductive oxide such as ITO or FTO on the above-mentioned transparent substrate 6, carbon, or an electrically conductive polymer. The thickness of the counter electrode substrate 9 is suitably determined corresponding to the size of the dye-sensitized solar cell 100, and although there are no particular limitations thereon, is, for example, 0.005 mm to 0.1 mm.

The catalyst layer 10 is made of, for example, platinum, a carbon-based material or an electrically conductive polymer.

(Encapsulating Portion)

Next, the encapsulating portion is formed on the working electrode 20. An acid-modified polyolefin-based thermoplastic resin is preferably used for the encapsulating portion. Examples of acid-modified polyolefin-based thermoplastic resins include acid-modified polyethylene-based thermoplastic resins and acid-modified polypropylene-based thermoplastic resins. In particular, acid-modified polyethylene-based thermoplastic resins are preferable. Acid-modified polyethylene-based thermoplastic resins have a comparatively low melting point in comparison with the case of using other acid-modified polyolefin-based thermoplastic resins. Consequently, when an acid-modified polyethylene-based thermoplastic resin is used for the acid-modified polyolefin-based thermoplastic resin, in comparison with the case of using other acid-modified polyolefin-based thermoplastic resins, adhesion to the surface of the working electrode 20 or counter electrode 2 by hot melting becomes easier. Here, a polyethylene-based thermoplastic resin refers to a thermoplastic resin that contains ethylene in a constituent unit thereof.

Examples of acid-modified polyethylene-based thermoplastic resins include ionomers, ethylene-methacrylic acid copolymers, maleic anhydride-modified polyethylenes and ethylene-acrylic acid copolymers. In particular, ionomers, ethylene-methacrylic acid copolymers or maleic anhydride-modified polyethylenes are preferable from the viewpoint of having high adhesiveness with the working electrode 20. Furthermore, an acid-modified polyolefin refers to that in which an acid has been randomly copolymerized, alternately copolymerized, block copolymerized or graft copolymerized to a polyolefin, or that in which these have been neutralized with metal ions. In addition, acid-modified polyethylene refers to that in which an acid has been randomly copolymerized, alternately copolymerized, block copolymerized or graft copolymerized to polyethylene, or that in which these have been neutralized with metal ions. As an example thereof, since ethylene-methacrylic acid copolymer is obtained by copolymerization of ethylene and methacrylic acid, it is an acid-modified polyethylene, and an ionomer obtained by neutralizing ethylene-methacrylic acid copolymer with metal ions is also an acid-modified polyethylene.

[Dye Adsorbing Step]

Next, a photosensitizing dye is adsorbed onto the porous oxide semiconductor layer 8 of the working electrode 20. In order to accomplish this, the working electrode 20 is immersed in a solution containing a photosensitizing dye, and after allowing the dye to adsorb onto the porous oxide semiconductor layer 8, excess dye is rinsed off with a solvent component of the above-mentioned solution followed by drying to adsorb the photosensitizing dye onto the porous oxide semiconductor layer 8. However, the photosensitizing dye can also be adsorbed onto the porous oxide semiconductor layer 8 by adsorbing the photosensitizing dye onto the porous oxide semiconductor porous layer 8 by coating a solution containing the photosensitizing dye onto the porous oxide semiconductor layer 8 followed by drying.

Examples of photosensitizing dye include ruthenium complexes having a ligand containing a bipyridine structure or terpyridine structure, and organic dyes such as porphyrin, eosin, rhodamine or merocyanine.

[Electrolyte Arrangement Step]

Next, the electrolyte 3 is arranged on the working electrode 20 on the inside of the encapsulating portion. The electrolyte 3 can be obtained by injecting or printing onto the working electrode 20 on the inside of the encapsulating portion.

Here, in the case the electrolyte 3 is a liquid, the electrolyte 3 is preferably injected beyond the encapsulating portion until it overflows to the outside of the encapsulating portion. In this case, the electrolyte 3 can be adequately injected to the inside of the encapsulating portion. In addition, when adhering the encapsulating portion and the counter electrode 2, air can be adequately evacuated from the cell space surrounded by the working electrode 20, the counter electrode 2 and the encapsulating portion, thereby making it possible to adequately improve photoelectric conversion efficiency.

The electrolyte 3 is normally formed of an electrolytic solution. This electrolytic solution contains, for example, a redox couple such as $I^-/I_3^-$ and an organic solvent. Examples of organic solvent that can be used include acetonitrile, methoxyacetonitrile, methoxypropionitrile, propionitrile, ethylene carbonate, propylene carbonate, diethyl carbonate or γ-butyrolactone. In addition to $I^-/I_3^-$, examples of redox couples include a bromine/bromide ion couple. The dye-sensitized solar cell 100 is particularly effective in the case of using for the electrolyte an electrolytic solution containing a volatile solute such as $I^-/I_3^-$ for the redox couple and an organic solvent that readily volatilizes at high temperatures, such as acetonitrile, methoxyacetonitrile or methoxypropionitrile. This is because, in this case, the change in internal pressure of the cell space caused by a change in ambient environmental temperature of the dye-sensitized solar cell 100 becomes particularly large, the electrolyte 3 easily leaks from the interface between the encapsulating portion and the counter electrode 2 and from the interface between the encapsulating portion and the working electrode 20. Furthermore, a gelling agent may also be added to the above-mentioned volatile solvent. In addition, the electrolyte 3 may also be made of an ionic liquid electrolyte formed of a mixture of an ionic liquid and a volatile component. In this case as well, this is due to the large change in internal pressure of the cell space caused by a change in ambient environmental temperature of the dye-sensitized solar cell 100. A known iodine salt such as a pyridinium salt, an imidazolium salt and a triazolium salt that is an ambient temperature molten salt which is in a molten state in the vicinity of room temperature is used for the ionic liquid. An example of such a ambient temperature molten salt is preferably 1-ethyl-3-methylimidazolium bis(trifluoromethylsulfonyl)imide. In addition, examples of volatile components include the above-mentioned organic solvents as well as 1-methyl-3-methylimidazolium iodide, LiI, $I_2$ and 4-t-butylpyridine. Furthermore, nanocomposite ion-gel electrolyte, which is a quasi-solid electrolyte obtained by mixing the above-mentioned ionic liquid electrolyte with $SiO_2$, $TiO_2$ or nanoparticles such as carbon nanotube to form a gel may also be used for electrolyte 3, and ionic liquid electrolyte may be used that is obtained by gelling using an organic gelling agent such as polyvinylidene fluoride, polyethylene oxide derivatives or amino acid derivatives.

[Encapsulation Step]

Next, the working electrode 20 and the counter electrode 2 are opposed under atmospheric pressure. The encapsulating portion and the counter electrode 2 are then adhered by melting the encapsulating portion while applying pressure under atmospheric pressure. Namely, the electrolyte 3 is encapsulated by the working electrode 20, the counter electrode 2 and the encapsulating portion. In this manner, the working electrode 20 and the counter electrode 2 are connected by the encapsulating portion.

At this time, the pressure applied to the encapsulating portion is normally 0.1 MPa to 10 MPa, preferably 1 MPa to 8 MPa and more preferably 3 MPa to 8 MPa.

In addition, the temperature when melting the encapsulating portion is equal to or higher than the melting point of the thermoplastic resin that forms the encapsulating portion. If the above-mentioned temperature is lower than the melting point of the thermoplastic resin, since the thermoplastic resin that forms the encapsulating portion does not melt, the encapsulating portion can no longer be formed by adhering the encapsulating portion and the counter electrode 2.

However, the temperature when melting the encapsulating portion is preferably equal to or lower than the (melting point of the thermoplastic resin+200° C.). If the above-mentioned temperature exceeds the (melting point of the thermoplastic resin+200° C.), there is the risk of the thermoplastic resin contained in the encapsulating portion being decomposed by heat.

The dye-sensitized solar cell 100 is obtained in this manner. According to the dye-sensitized solar cell 100, the formation of voids and cracks penetrating the plurality of thermoplastic wiring protective layers 4a to 4c is adequately inhibited in the working electrode 20. Consequently, even if the working electrode 20 makes contact with the electrolyte 3, the electrolyte 3 is prevented from entering through voids and cracks penetrating the thermoplastic wiring protective layers 4a to 4c and reaching the current collector wiring 5. As a result, corrosion of the current collector wiring 5 by the electrolyte 3 is adequately inhibited, and electricity can be extracted efficiently.

In addition, in the dye-sensitized solar cell 100, a thermoplastic wiring protective layer farther from the current collector wiring 5 has a lower softening point. Consequently, even if the working electrode 20 is placed in a high-temperature environment during the encapsulation step, for example, heat is first absorbed by the thermoplastic wiring protective layer 4c having a low softening point, thereby making it difficult for heat to reach the thermoplastic wiring protective layers 4a and 4b close to the current collector wiring 5. Consequently, softening of the thermoplastic wiring protective layers 4a and 4b closer to the current collector wiring 5 can be adequately inhibited. Thus, even if voids and cracks are formed in each of the thermoplastic wiring protective layers 4a, 4b and 4c, the joining of these voids and cracks to penetrate the thermoplastic wiring protective layers 4a, 4b and 4c can be adequately inhibited. In particular, the working electrode 20 is useful in the case of forming the encapsulating portion directly above the wiring portion 11 by heating and melting the thermoplastic resin through the counter electrode 2. Namely, in the case of heating and melting the thermoplastic resin arranged directly above the wiring portion 11 through the counter electrode 2, the thermoplastic wiring protective layer 4c, which is located farthest from the current collector wiring 5 among the thermoplastic wiring protective layers 4a to 4c, is heated first, and as a result of heat being adequately absorbed there, it is difficult for heat to reach the thermoplastic wiring protective layer 4a.

Accordingly, even if the thermoplastic wiring protective layer 4c of the working electrode 20 makes contact with the electrolyte 3, corrosion of the current collector wiring 5 caused by entry of the electrolyte 3 through the voids and cracks can be adequately inhibited and electricity can be efficiently extracted.

The present invention is not limited to the above-mentioned embodiment. Although the wiring protective layer 4 is formed of three thermoplastic wiring protective layers, for example, in the above-mentioned embodiment, the wiring protective layer 4 may also be formed of two thermoplastic wiring protective layers or may be formed of four or more thermoplastic protective wiring layers.

In addition, although all of the thermoplastic wiring protective layers 4a to 4c are formed of glass frit protective layers composed mainly of glass in the above-mentioned embodiment, there are no particular limitations thereon provided the thermoplastic wiring protective layers 4a to 4c have thermoplasticity, and for example, all of the thermoplastic wiring protective layers 4a to 4c may also be formed of thermoplastic resin layers made of thermoplastic resin.

In this case as well, carrying out heat treatment at a heat treatment temperature lower than the softening point of the thermoplastic wiring protective layer formed immediately prior thereto when forming the second and subsequent thermoplastic wiring protective layers 4b and 4c is the same as in the above-mentioned embodiment.

Here, although there are no particular limitations on the thermoplastic resin that composes the thermoplastic wiring protective layers, acid-modified polyolefin-based thermoplastic resins are used preferably similar to the encapsulating portion. Examples of acid-modified polyolefin-based thermoplastic resins include acid-modified polyethylene-based thermoplastic resins or acid-modified propylene-based thermoplastic resins. Acid-modified polyethylene-based thermoplastic resins are particularly preferable. This is because the melting point of these resins is comparatively low in comparison with the case of using an acid-modified polyolefin-based thermoplastic resin other than an acid-modified polyethylene-based thermoplastic resin. Consequently, when an acid-modified polyethylene-based thermoplastic resin is used for the acid-modified polyolefin-based thermoplastic resin, in comparison with the case of using other acid-modified polyolefin-based thermoplastic resins, adhesion to the surface of the current collector wiring 5 or the thermoplastic wiring protective layer formed immediately prior thereto by hot melting becomes easier. Here, a polyethylene-based thermoplastic resin refers to a thermoplastic resin that contains ethylene in a constituent unit thereof.

Examples of acid-modified polyethylene-based thermoplastic resins include ionomers, ethylene-methacrylic acid copolymers, maleic anhydride-modified polyethylenes and ethylene-acrylic acid copolymers. In particular, ionomers, ethylene-methacrylic acid copolymers and maleic anhydride-modified polyethylenes are preferable from the viewpoint of having high adhesiveness with the working electrode 20. Furthermore, an acid-modified polyolefin refers to that in which an acid has been randomly copolymerized, alternately copolymerized, block copolymerized or graft copolymerized to a polyolefin, or that in which these have been neutralized with metal ions. In addition, acid-modified polyethylene refers to that in which an acid has been randomly copolymerized, alternately copolymerized, block copolymerized or graft copolymerized to polyethylene, or that in which these have been neutralized with metal ions. As an example thereof, since ethylene-methacrylic acid copolymer is obtained by copolymerization of ethylene and methacrylic acid, it is an acid-modified polyethylene, and an ionomer obtained by neutralizing ethylene-methacrylic acid copolymer with metal ions is also an acid-modified polyethylene.

Moreover, although the working electrode 20 has the current collector wiring 5 and that current collector wiring 5 is protected with the wiring protective layer 4 in the above-mentioned embodiment, in the case the counter electrode 2 is a so-called see-through electrode, the counter electrode 2 may have the current collector wiring 5 and that current collector wiring 5 may be protected with the wiring protective layer 4.

In addition, although the wiring protective layer 4 of the wiring portion 11 is formed of three thermoplastic wiring protective layers 4a to 4c and the thermoplastic wiring protective layer 4c serving as the outermost layer of the wiring protective layer 4 makes contact with the electrolyte 3 in the above-mentioned present embodiment, as shown in FIG. 9, a wiring portion 111 may be prevented from contacting the electrolyte 3 by covering the thermoplastic wiring protective layer 4c of the wiring protective layer 4 with an insulating resin layer 13. In this case, even if the plurality of thermoplastic wiring protective layers 4a to 4c have glass frit protective layers consisting mainly of a glass component, damage to the surface of the counter electrode 2 is adequately inhibited by the insulating resin layer 13. An acid-modified polyolefin-based resin or polyimide resin, for example, can be used for the insulating resin layer 13. A polyimide resin is particularly preferable. In this case, the insulating resin layer 13 can be formed by heating at a high temperature without contaminating the porous oxide semiconductor layer 8 with volatilized organic solvent.

EXAMPLES

Although the following provides a more specific explanation of the contents of the present invention by listing examples thereof, the present invention is not limited to the following examples.

Example 1

To begin with, an FTO substrate measuring 10 cm×10 cm×4 mm was prepared. Continuing, after coating a titanium oxide paste (Ti Nanoixide T/sp, manufactured by Solaronix SA) onto the FTO substrate by doctor blade coating to a thickness of 10 μm, the coated substrate was baked for 3 hours at 150° C. to form a porous oxide semiconductor layer on the FTO substrate.

Next, a silver paste for current collector wiring was coated so as to surround the porous oxide semiconductor layer followed by baking for 1 hour at a heat treatment temperature of 520° C. to obtain current collector wiring having a softening point of 518° C.

Next, a glass paste mainly made of $SiO_2$—$B_2O_3$—$Bi_2O_3$ was prepared, and coated so as to cover the current collector wiring. Next, this glass paste was baked for 1 hour at a heat treatment temperature of 510° C. to obtain a first thermoplastic wiring protective layer having a softening point of 510° C.

Next, a glass paste mainly made of $SiO_2$—$B_2O_3$—$Bi_2O_3$ was coated so as to cover the first thermoplastic wiring protective layer. A glass paste having a different blending ratio of $SiO_2$, $B_2O_3$ and $Bi_2O_3$ from the glass paste used to form the first thermoplastic wiring protective layer was used for the glass paste used at this time. Next, this paste was baked for 1 hour at a heat treatment temperature of 480° C. to obtain a second thermoplastic wiring protective layer having a softening point of 475° C.

Next, a glass paste mainly made of $SiO_2$—$B_2O_3$—$Bi_2O_3$ was coated so as to cover the second thermoplastic wiring protective layer. A glass paste having a different blending ratio of $SiO_2$, $B_2O_3$ and $Bi_2O_3$ from the glass pastes used to form the first and second thermoplastic wiring protective layers was used for the glass paste used at this time. Next, this glass paste was baked for 1 hour at a heat treatment temperature of 450° C. to obtain a third thermoplastic wiring protective layer having a softening point of 440° C. A working electrode was fabricated in this manner. Furthermore, the above-mentioned heat treatment temperature refers to the average value of temperature during heat treatment, and refers to a value obtained by averaging measured values obtained by measuring the temperature of a thermocouple installed in the paste targeted for heat treatment at one minute intervals.

Example 2

A working electrode was fabricated in the same manner as Example 1 with the exception of not forming the third thermoplastic wiring protective layer. Thus, the heat treatment temperatures and softening points of the first thermoplastic wiring protective layer and the second thermoplastic wiring protective layer were the same as in Example 1 as shown in Table 1.

Examples 3 to 12

Working electrodes were fabricated in the same manner as Example 2 with the exception of making the softening points of the first and second thermoplastic wiring protective layers and the heat treatment temperatures when forming the first and second thermoplastic wiring protective layers as shown in Table 1.

Example 13

A working electrode was fabricated in the same manner as Example 2 with the exception of using an acid-modified polyolefin-based thermoplastic resin made of an anhydride-modified ethylene-vinyl acetate copolymer (trade name: Bynel, manufactured by Dupont Corp.) for the material that composes the first and second thermoplastic wiring protective layers, and making the softening points of the first and second thermoplastic wiring protective layers and the heat treatment temperatures when forming the first and second thermoplastic wiring protective layers as shown in Table 1.

Example 14

A working electrode was fabricated in the same manner as Example 2 with the exception of using an acid-modified polyolefin-based thermoplastic resin made of an ethylene-methacrylic acid copolymer (trade name: Nucrel, manufactured by Du Pont-Mitsui Polychemicals Co., Ltd.) for the material that composes the first and second thermoplastic wiring protective layers, and making the softening points of the first and second thermoplastic wiring protective layers and the heat treatment temperatures when forming the first and second thermoplastic wiring protective layers as shown in Table 1.

Comparative Example 1

A working electrode was obtained in the same manner as Example 2 with the exception of making the softening point of the second thermoplastic wiring protective layer and the heat treatment temperature when forming the second thermoplastic wiring protective layer as shown in Table 1.

[Characteristics Evaluation]

Twenty electrodes each of the working electrodes of Examples 1 to 14 and Comparative Example 1 were prepared. After immersing these working electrodes in an electrolyte at 85° C. containing lithium iodide at 0.05 M, lithium iodide at 0.1 M, 1,2-dimethyl-3-propylimidazolium iodide (DMPII) at 0.6 M and 4-tert-butyl pyridine at 0.5 M and using a volatile solvent made of acetonitrile for the main solvent and holding therein for 1000 hours, the working electrodes were removed from the electrolyte. The number of working electrodes in which the current collector wiring had been corroded was counted followed by calculating the ratio of working electrodes in which the current collector wiring had been corroded. The results are shown in Table 1. Furthermore, evaluation of the presence of corrosion of the current collector wiring was made by observing the current collector wiring with a light microscope, and judging whether or not the current collector wiring was present in the same manner as prior to immersion in electrolyte.

EXPLANATION OF REFERENCE NUMERALS

2 Counter electrode (electrode)
3 Electrolyte
4a,4b,4c Thermoplastic wiring protective layers
5 Current collector wiring
6 Transparent substrate
7 Transparent electrically conductive layer
8 Porous oxide semiconductor layer
12 Electrically conductive substrate
13 Insulating resin layer
20 Working electrode (electrode)
100 Dye-sensitized solar cell

The invention claimed is:

1. A production method of an electrode for a dye-sensitized solar cell, comprising:
a first step of providing current collector wiring on an electrically conductive substrate; and
a second step of producing an electrode for a dye-sensitized solar cell by sequentially forming a plurality of thermoplastic wiring protective layers on the current collector wiring so that softening points of the thermoplastic wiring protective layers become lower as the thermoplastic wiring protective layers move away from the current collector wiring, and by heat-treating the second and subsequent thermoplastic wiring protective layers from the current collector wiring at a heat treatment temperature lower than a softening point of the thermoplastic wiring protective layer formed immediately prior thereto, and

TABLE 1

| | Glass frit contained in current collector wiring | | First thermoplastic wiring protective layer | | | Second thermoplastic wiring protective layer | | | Third thermoplastic wiring protective layer | | | Ratio of corroded working electrodes (%) |
|---|---|---|---|---|---|---|---|---|---|---|---|---|
| | Softening point (° C.) | Heat treatment temp. (° C.) | Softening point (° C.) | Heat treatment temp. (° C.) | Material | Softening point (° C.) | Heat treatment temp. (° C.) | Material | Softening point (° C.) | Heat treatment temp. (° C.) | Material | |
| Ex. 1 | 518 | 520 | 510 | 510 | Glass | 475 | 480 | Glass | 440 | 450 | Glass | 0 |
| Ex. 2 | 518 | 520 | 510 | 510 | Glass | 475 | 480 | Glass | — | — | — | 10 |
| Ex. 3 | 518 | 520 | 400 | 450 | Glass | 390 | 395 | Glass | — | — | — | 20 |
| Ex. 4 | 518 | 520 | 420 | 450 | Glass | 400 | 410 | Glass | — | — | — | 12 |
| Ex. 5 | 518 | 520 | 450 | 500 | Glass | 420 | 430 | Glass | — | — | — | 5 |
| Ex. 6 | 518 | 520 | 480 | 500 | Glass | 450 | 470 | Glass | — | — | — | 5 |
| Ex. 7 | 630 | 640 | 550 | 600 | Glass | 500 | 530 | Glass | — | — | — | 10 |
| Ex. 8 | 630 | 640 | 590 | 600 | Glass | 550 | 570 | Glass | — | — | — | 15 |
| Ex. 9 | 630 | 640 | 620 | 620 | Glass | 590 | 600 | Glass | — | — | — | 22 |
| Ex. 10 | 518 | 520 | 510 | 510 | Glass | 505 | 505 | Glass | — | — | — | 20 |
| Ex. 11 | 518 | 520 | 510 | 510 | Glass | 500 | 505 | Glass | — | — | — | 15 |
| Ex. 12 | 518 | 520 | 510 | 510 | Glass | 490 | 500 | Glass | — | — | — | 5 |
| Ex. 13 | 518 | 520 | 144 | 160 | Bynel | 127 | 140 | Bynel | — | — | — | 15 |
| Ex. 14 | 518 | 520 | 98 | 110 | Nucrel | 90 | 95 | Nucrel | — | — | — | 18 |
| Comp. Ex. 1 | 518 | 520 | 510 | 510 | Glass | 510 | 510 | Glass | — | — | — | 75 |

As shown in Table 1, in contrast to the ratios of corroded working electrodes being 0 to 22% for the working electrodes of Examples 1 to 14, the ratio of corroded working electrodes for the working electrode of Comparative Example 1 was 75%.

On the basis of these results, according to the electrode for a dye-sensitized solar cell of the present invention, corrosion of current collector wiring by electrolyte was confirmed to able to be adequately inhibited.

wherein the plurality of thermoplastic wiring protective layers have at least two thermoplastic wiring protective layers of which main components are formed of a glass component, and the at least two thermoplastic wiring protective layers are adjacent to each other;

a softening point of a first thermoplastic wiring protective layer from the current collector wiring is 420° C. to 590° C., and a difference in softening points between adjacent thermoplastic wiring protective layers is 10° C. to 100° C.

2. The production method of an electrode for a dye-sensitized solar cell according to claim 1, wherein the main components are formed of the same material.

3. The production method of an electrode for a dye-sensitized solar cell according to claim 1, wherein the second step includes a step of obtaining the electrode by covering the plurality of thermoplastic wiring protective layers with an insulating resin layer after having formed the plurality of thermoplastic wiring protective layers.

4. An electrode for a dye-sensitized solar cell obtained according to the production method of an electrode for a dye-sensitized solar cell according to claim 1.

* * * * *